United States Patent [19]

Matsumoto

[11] Patent Number: 4,840,921
[45] Date of Patent: Jun. 20, 1989

[54] PROCESS FOR THE GROWTH OF III-V GROUP COMPOUND SEMICONDUCTOR CRYSTAL ON A SI SUBSTRATE

[75] Inventor: Takashi Matsumoto, Tokyo, Japan

[73] Assignee: NEC Corporation, Tokyo, Japan

[21] Appl. No.: 213,940

[22] Filed: Jun. 30, 1988

[30] Foreign Application Priority Data

| Jul. 1, 1987 | [JP] | Japan | 62-165694 |
| Jul. 1, 1987 | [JP] | Japan | 62-165695 |
| Jul. 13, 1987 | [JP] | Japan | 62-175105 |
| Jul. 14, 1987 | [JP] | Japan | 62-176374 |

[51] Int. Cl.⁴ .................................... H01L 21/205
[52] U.S. Cl. ................................ 437/89; 437/108; 437/132
[58] Field of Search ............... 437/132, 108, 111; 148/DIG. 149, DIG. 56

[56] References Cited

U.S. PATENT DOCUMENTS

| 3,963,538 | 6/1976 | Broadie et al. | 437/128 |
| 3,975,218 | 8/1976 | Ruehrwein | 437/132 |
| 4,504,329 | 3/1985 | Quinlan et al. | 437/133 |
| 4,657,603 | 4/1987 | Kruehler et al. | 437/132 |
| 4,808,551 | 2/1989 | Mori et al. | 437/81 |

OTHER PUBLICATIONS

Akiyama et al., "Growth of Single Domain GaAs Layer on (100)-Oriented Si Substrate by MOCVD", Japanese Journal of Applied Physics, vol. 23, No. 11, Nov., 1984, pp. L843-L845.

USUI et al., "GaAs Atomic Layer Epitaxy by Hydride VPE", Japanese Journal of Applied Physics, vol. 25, No. 3, Mar., 1986, pp. L212-L214.

Primary Examiner—Olik Chaudhuri
Attorney, Agent, or Firm—Foley & Lardner, Schwartz, Jeffery, Schwaab, Mack, Blumenthal & Evans

[57] ABSTRACT

In a process for the growth of III-V group compound semiconductor crystal on a Si substrate, chloride gas of an element selected from In and Ga of III group elements and hydride gas of an element selected from V group elements are alternately supplied into a growing chamber to grow III-V group compound semiconductor crystal on a Si substrate. As a result, the crystal is of a good selective growth property and of a good crystal property.

5 Claims, 2 Drawing Sheets

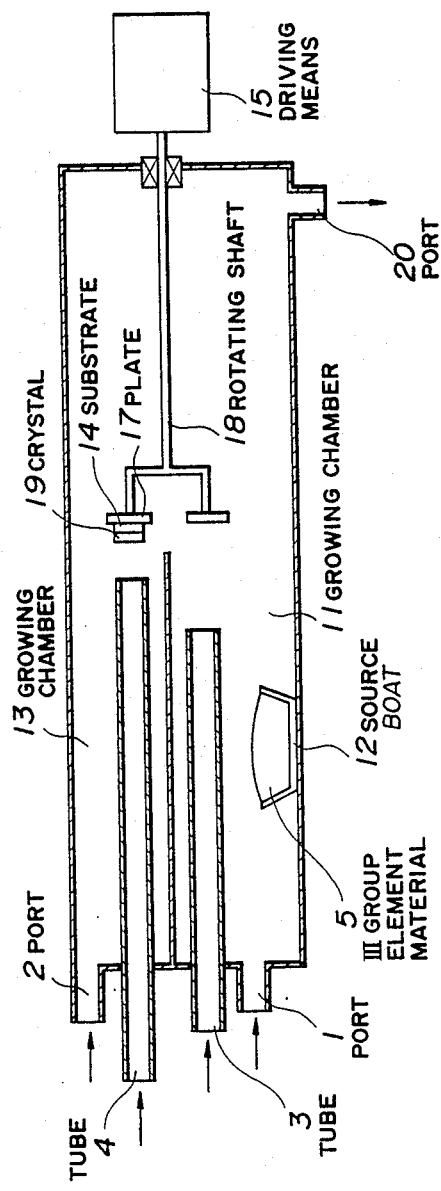
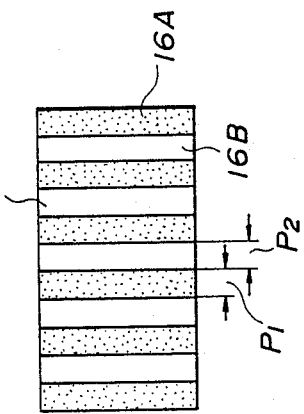
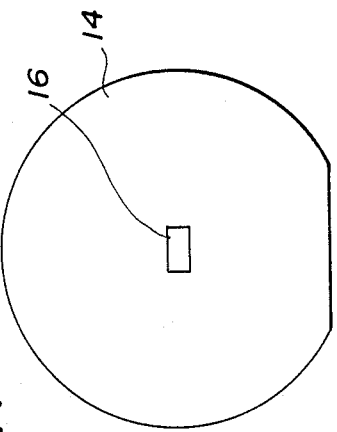

PROCESS FOR THE GROWTH OF III-V GROUP COMPOUND SEMICONDUCTOR CRYSTAL ON A SI SUBSTRATE

FIELD OF THE INVENTION

The invention relates to a process for the growth of III-V group compound semiconductor crystal on a Si substrate, and more particularly to a process for the growth of III-V group compound semiconductor crystal on a Si substrate in which a Si substrate is alternately exposed to gas seed including III group element and gas seed including V group element.

BACKGROUND OF THE INVENTION

These days, it has been tried to grow III-V group compound semiconductor crystal on a Si substrate. Especially, the growth of GaAs which is a typical one of III-V group compound semiconductor crystals has been most actively studied in the research and development. In a conventional process for the growth of GaAs on a Si substrate, a single crystal GaAs layer is grown on an amorphous GaAs layer which is grown on a Si substrate at a low temperature to function as a buffer layer because it is difficult to grow a GaAs layer with a good quality directly on the Si substrate. The conventional process has been proposed to be "a two temperature growing process" as described on pages L843 to L845 of "Japanese Journal of Applied Physics, Vol. 23, No. 11, Nov. 1984".

In a general process for growing GaAs layer such as molecular beam epitaxy (MBE), metalorganic chemical vapor deposition (MOCVD) and so on, however, a GaAs layer of a good crystal property is not grown because a continuous film of the GaAs layer is not obtained, but island like film thereof is resulted in a case where a single crystal GaAs layer is tried to be grown directly on a Si substrate.

Otherwise, a continuous film of a amorphous GaAs layer is obtained when a growing temperature is lowered therein. Then, when the amorphous GaAs layer is subject to a heat treatment, it is crystallized to be a single crystal as the aforementioned buffer layer. Even in a process for the growth of InP layer, InGaP layer etc., a similar amorphous buffer layer is utilized in the same manner as described above.

In the conventional MBE process in which Ga metal is utilized or the conventional MOCVD process in which trimethyl-Gallium(TMG) or triethyl-Gallium (TEG) is utilized in the two temperature growing process, however, there is a disadvantage that a predetermined selective growth property is not obtained because a polycrystal is grown on a SiO$_2$ mask provided on a Si substrate.

Accordingly, it is an object of the invention to provide a process for the growth of III-V group compound semiconductor crystal on a Si substrate in which a III-V group compound layer of a good crystal property is grown on a Si substrate.

It is a further object of the invention to provide a process for the growth of III-V compound semiconductor crystal on a Si substrate in which the selective growth of a III-V group compound layer is performed on a Si substrate.

According to the invention, a process for the growth of III-V group compound semiconductor crystal on a Si substrate comprises, placing a Si substrate on a mount positioned in a growing chamber, heating said Si substrate at a predetermined temperature, supplying first gas seed including one selected from In and Ga of III group elements, and second gas seed including one of V group elements alternately into said growing chamber, and growing III-V group compound semiconductor crystal on said Si substrate, wherein said one selected from In and Ga is a chloride thereof.

BRIEF DESCRIPTION OF THE DRAWINGS

The invention will be explained in more detail in conjunction with appended drawings wherein, FIG. 1 is an explanatory view showing an apparatus for the growth of III-V group compound semiconductor crystal on a Si substrate in which a process for the growth of III-V group compound semiconductor crystal on a Si substrate is embodied in a first embodiment according to the invention, FIG. 2A is a plane view showing a Si substrate on which a SiO$_2$ film for the selective growth of crystal is provided in the first embodiment, FIG. 2B is an enlarged view showing a portion of the Si substrate in FIG. 2A.

DESCRIPTION OF PREFERRED EMBODIMENTS

Figure 3:
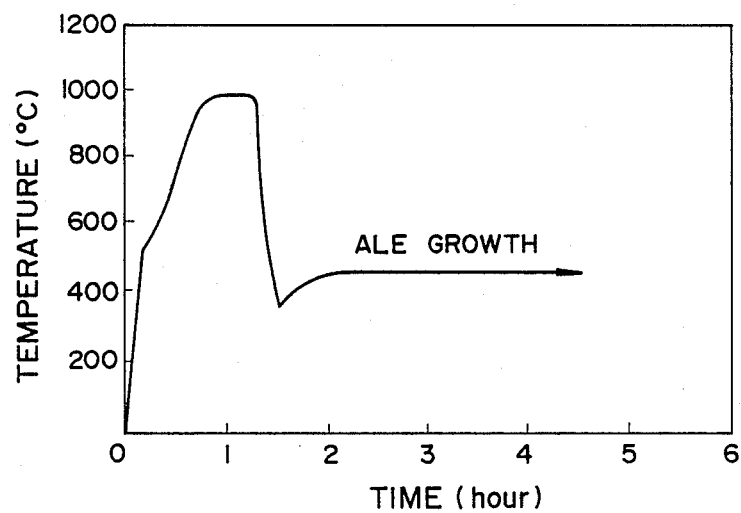
FIG. 3 is an explanatory diagram showing a relation between a temperature of a Si substrate and a time in the first embodiment.

In FIG. 1, there is shown an apparatus for the growth of III-V group compound semiconductor in which a process for the growth of III-V group compound semiconductor crystal on a Si substrate in a first embodiment according to invention is performed. The apparatus comprises first and second growing chambers 11 and 13, a pair of plates 17 on one of which a Si substrate 14 is placed, and a driving means 15 for moving the plates 17 from the first growing chamber 11 to the second growing chamber 13 and vice versa by means of a rotating shaft 18. The first growing chamber 11 is provided with a supply port 1 through which HCl gas for producing a chloride of III group element and H$_2$ carrier gas are supplied thereinto and with a supply tube 3 through which H$_2$ carrier gas is supplied thereinto, while the second growing chamber 13 is provided with a supply port 2 through which H$_2$ carrier gas is supplied thereinto and with a supply tube 4 through which hydride gas of V group element for producing III-V group compound semiconductor crystal and H$_2$ carrier gas are supplied thereinto. In the first growing chamber 11, a source boat 12 is positioned to place III group element 5 thereon. The first and second chambers 11 and 13 are communicated to an exhaust port 20 to maintain a predetermined atmospheric condition therein by exhausting interior gas. Such an apparatus is described on pages L 212 to L 214 of "Japanese Journal of Applied Physics, Vol. 25, No. 3, March 1986".

Next, a process for the growth of III-V group compound semiconductor crystal on a Si substrate in a first embodiment according to the invention will be explained in following Examples 1 to 4 in which III-V group compound semiconductor crystal is grown in the apparatus described above.

[EXAMPLE 1]

In the apparatus as shown in FIG. 1, In is placed as the III group element 5 on the source boat 12, and a Si substrate 14 as shown in FIGS. 2A and 2B is placed on one of the plates 17. The Si substrate 14 is of a diameter of two inches and is deviated by three degrees in regard to (100) plane toward to <110> direction as defined by "Si(100)3° off to <110>". A SiO$_2$ film is made by thermal oxidation on the Si substrate 14, and is etched in a resist process to provide SiO$_2$ masks each having a width P$_1$ of 100 μm and a periodical interval P$_2$ of 100 μm which is a width of a non-masked portion 16B as shown in a portion 16 of the Si substrate 14 in FIGS. 2A and 2B.

A reaction pipe including the first and second growing chambers 11 and 13 is controlled to be heated at a predetermined temperature by a resistance heating furnace (not shown) so that a temperature of the substrate 14 is controlled to coincide with a programmed curve as shown in FIG. 3.

At first, the Si substrate 14 is positioned in the first growing chamber 11 as different from the illustration in FIG. 1, and natural oxide of the non-masked portions 16B are removed at a temperature of 970° C. in an atmosphere of H$_2$. Then, a temperature of the Si substrate 14 is cooled down to 450° C. (it may be changed from 350° C. to 600° C.), and HCl gas is supplied through the supply port 1 into the first growing chamber 11 to produce InCl which is absorbed to the Si substrate 14. Thereafter, the Si substrate 14 is moved to the second growing chamber 13 into which P$_3$, gas is then supplied through the supply tube 4 so that InP layer is grown on the non-masked portions 16B of the Si substrate 14 by one molecular layer. This is repeated by one thousand times. As a result, InP layer having a predetermined thickness is grown by atomic layer epitaxy (ALE).

In the process, gas flowing amounts are as follows.

| PORT | GAS | AMOUNT |
| --- | --- | --- |
| PORT 1 | HC 1 | 10 sccm |
| TUBE 4 | PH$_3$ | 125 sccm |
| PORTS 1 & 2 TUBES 3 & 4 | H$_2$ | 5 slm |

Figure 4:
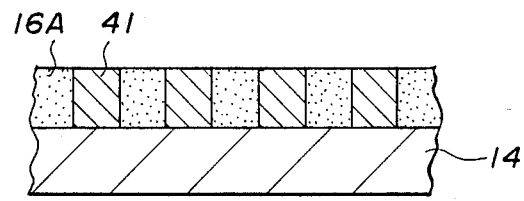
FIG. 4 is a cross-sectional view showing a Si substrate on which III-V group compound semiconductor crystal is grown in the first embodiment.

FIG. 4 shows the Si substrate 14 of 300 to 350 μm thickness on which the SiO$_2$ masks 16A each having a thickness of 3000 Å and the InP crystal layers 41 each having the same thickness as those of the SiO$_2$ masks 16A. In general, a thickness of an atomic layer of InP is approximately 2.9 Å in a case of (100) plane which is usually utilized. The epitaxial layers 41 thus grown have good mirror surface properties and it is confirmed in view of a film thickness that a single molecular growth is realized. Further, an excellent selective growth in which no InP layer is grown on the SiO$_2$ masks is also realized. Still further, only single crystal spots are observed by a reflection high energy electron diffraction method (RHEED), and InP epitaxial layer having extremely less crystal defect is observed in its cross-section by a transmission electron microscope.

[EXAMPLE 2]

In the apparatus as shown in FIG. 1, the same process conditions as in the Example 1 are adopted except that Ga is placed as the III group element 5 on the source boat 12.

As shown in FIG. 4, the Si substrate 14 of 300 to 350 μm thickness on which the SiO$_2$ masks 16A each having a thickness of 3000 Å and GaP crystal layers 41 each having the same thickness as those of the SiO$_2$ masks 16A is obtained. In general, a thickness of an atomic layer of GaP is approximately 2.7 Å in a case of (100) plane which is usually utilized. The epitaxial layers 41 have good mirror surface properties and it is confirmed in view of a film thickness that a single molecular growth is realized. Further, an excellent selective growth in which no GaP layer is grown on the SiO$_2$ masks 16A is also realized. Still further, only single crystal spots are observed by a reflection high energy electron diffraction method (RHEED), and GaP epitaxial layer having extremely less crystal defect is observed in its cross-section by a transmission electron microscope.

[EXAMPLE 3]

In the apparatus as shown in FIG. 1, In is placed as the III group element 5 on the source boat 12, and a Si substrate 14 which is of a diameter of two inches and is deviated by three degrees in regard to (100) plane toward to <110> direction as defined by "Si(100)3° off to <110>" is placed on one of the plates 17. The Si substrate 14 is different from one as shown in FIGS. 2A and 2B in that no SiO$_2$ mask is formed thereon. A reaction pipe including the first and second growing chamber 11 and 13 is controlled to be heated at a predetermined temperature by a resistance heating furnace (not shown) so that a temperature of the substrate 14 is controlled to coincide with a programmed curve as shown in FIG. 3.

At first, the Si substrate 14 is positioned in the first growing chamber 11 as different from the illustration in FIG. 1, and natural oxide on the surface of the Si substrate 14 is removed at a temperature of 970° C. in an atmosphere of H$_2$. Then, a temperature of the Si substrate 14 is cooled down to 450° C., and HCl gas is supplied through the supply port 1 into the first growing chamber 11 to produce InCl which is absorbed to the Si substrate 14. Thereafter, the Si substrate 14 is moved to the second growing chamber 13 into which PH$_3$ gas is then supplied through the supply tube 4 so that InP layer is grown on the surface of the Si substrate 14 by one molecular layer. This is repeated by five hundred times. As a result, InP layer having a predetermined thickness is grown by atomic layer epitaxy (ALE).

In the process, gas flowing amounts are as follows.

| PORT | GAS | AMOUNT |
| --- | --- | --- |
| PORT 1 | HC 1 | 10 sccm |
| TUBE 4 | PH$_3$ | 125 sccm |
| PORTS 1 & 2 TUBES 3 & 4 | H$_2$ | 5 slm |

The epitaxial layer thus grown has a good mirror surface property, and it is confirmed in view of a film thickness that a single molecular growth is realized. A (200) X-ray diffraction strength of the InP layer is larger by twenty times than that of a specimen which is thermally treated in an atmosphere of P, and a half-width thereof is as good as 0.2°. Further, InP epitaxial layer having extremely less crystal defect is confirmed to be grown by a plain observation of a transmission electron microscope.

In the growth of InP on a Si substrate in accordance with the atomic layer epitaxy (ALE) as described above, it is confirmed that a single crystal epitaxial layer of a good crystal property can be obtained on a boundary surface of the Si substrate by supplying chloride of In at a low temperature to the Si substrate, the surface of which is cleaned, for the first stage. In the Example 3, although InCl, which is chloride of In, and $PH_3$ are alternatively supplied to the Si substrate to grow a InP layer on a whole surface thereof, the invention is not limited to this embodiment. For instance, processing time is shortened in a case where an atomic layer epitaxial growth is performed in such a manner as using a buffer layer described in the aforementioned two temperature growing process and a normal one of moleucular beam epitaxy (MBE), metalorganic chemical vapor deposition (MOCVD), vapor phase epitaxy (VPE) etc. is then adopted.

[EXAMPLE 4]

In the apparatus as shown in FIG. 1, the same process conditions as in the Example 3 are adopted except that Ga is placed as the III group element 5 on the source boat 12.

As a result, GaP layer having the same quality and property as that of the Example 3 is grown on the Si substrate 14, although the explanations are omitted to be repeated here.

Figure 5:
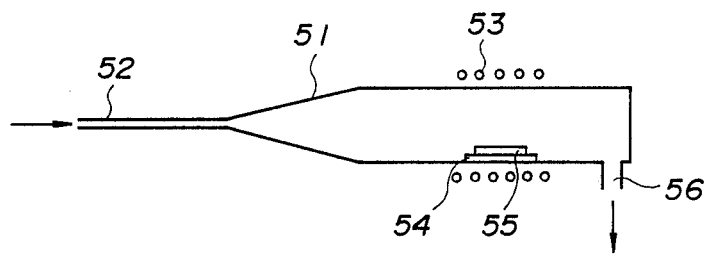
FIG. 5 is an explanatory view showing an apparatus for the growth of III-V group compound semiconductor crystal on a Si substrate in which a process for the growth for III-V group compound semiconductor crystal on a Si substrate is embodied in a second embodiment according to the invention.

In FIG. 5, there is shown an apparatus for the growth of III-V group compound semiconductor crystal on a Si substrate in which a process for the growth of III-V group compound semiconductor crystal on a Si substrate in a second embodiment according to the invention is performed. The apparatus comprises a growing chamber 51 in which a carbon susceptor 54 is provided, and a radio frequency coil means 53 for heating a substrate 55 placed on the carbon susceptor 54 up to a predetermined temperature. The growing chamber 51 is provided with a supply port 52 through which chloride of III group element, hydride of V group element, and carrier gas are supplied thereinto.

Next, a process for the growth of III-V group compound semiconductor crystal on a Si substrate in the second embodiment will be explained in following Examples 1 and 2 in which atomic layer epitaxy (ALE) is performed based on metalorganic chemical vapor deposition (MOCVD).

[EXAMPLE 1]

In the apparatus as shown in FIG. 5, a Si substrate 55 as shown in FIGS. 2A and 2B is placed on the carbon susceptor 54, and dimethyle-indium-chloride $(CH_3)_2InCl$ and $AsH_3$ are used as chloride of III group element and hydride of V group element. The same program of an atomic layer growth as shown in FIG. 3 is used in the Example 1.

At first, natural oxide of non-masked portions of the Si substrate 55 are removed at a temperature of 970° C. in accordance with the heating of the high radio frequency means 53, and a temperature of the Si substrate 55 is then cooled down to 450° C. In the circumstance, $(CH_3)_2InCl$ is supplied through the supply port 52 to the growing chamber 51 for four seconds, and then $AsH_3$ for five seconds thereby to grow a molecular layer of InAs layer. This is repeated by one thousand times. In the process, gas partial pressures are as follows.

| GAS | PRESSURE |
| --- | --- |
| $(CH_3)_2$ InCl | $5 \times 10^{-6}$ atm |
| $AsH_3$ | $5 \times 10^{-4}$ atm |
| $H_2$ | 5 slm |

In the process described above, epitaxial layers of good mirror surface properties are obtained on the non-masked portions of the Si substrate 55, and it is confirmed in a consideration of a growing film thickness that a single molecular growth is realized. Further, only single crystal spots are observed by a reflection high energy electron diffraction method, and it is confirmed by a transmission electron microscope that InAs epitaxial layer having extremely less crystal defect is grown. These results verify that a good selective growth property is resulted from the use of chloride of In in the growth of InAs on a Si substrate by an atomic layer epitaxial method, and that an epitaxial layer thus grown is of a good crystal property.

[EXAMPLE 2]

In the apparatus as shown in FIG. 5, a Si substrate 55 as shown in FIGS. 2A and 2B is placed on the carbon susceptor 54, and diethyl-gallium-chloride $(C_2H_5)_2GaCl$ and $AsH_3$ are used as chloride of III group element and hydride of V group element. The same program of an atomic layer growth as shown in FIG. 3 is used in the example 1.

At first, natural oxide of non-masked portions of the Si substrate 55 are removed at a temperature of 970° C. in accordance with the heating of the radio frequency means 53, and a temperature of the Si substrate 55 is then cooled down to 450° C. In the circumstance, $(C_2H_5)_2GaCl$ is supplied through the supply port 52 to the growing chamber 51 for four seconds, and then $AsH_3$ for five seconds thereby to grow a molecular layer of GaAs layer. This is repeated by one thousand times. In the process, gas partial pressures are as follows.

| GAS | PRESSURE |
| --- | --- |
| $(CH_3)_2$Incl. | $5 \times 10^{-6}$ atm |
| $AsH_3$ | $5 \times 10^{-4}$ atm |
| $H_2$ | 5 slm |

Even in the Example 2, the same results as in the Example 1 are obtained, although the explanations are omitted to be repeated here.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A process for the growth of III-V group compound semiconductor crystal on a Si substrate comprising, placing a Si substrate on a mount positioned in a growing chamber, heating said Si substrate at a predetermined temperature, supplying first gas seed including one selected from In and Ga of III group elements, and second gas seed including one of V group elements alternately into said growing chamber, and growing III-V group compound semiconductor crystal on said Si substrate, wherein said one selected from In and Ga is a chloride thereof.

2. A process for the growth of III-V group compound semiconductor crystal on a Si substrate according to claim 1, wherein said Si substrate is masked partially with $SiO_2$ film, and said III-V group compound semiconductor crystal is grown only on non-masked portion of said Si substrate.

3. A process for the growth of III-V group compound semiconductor crystal on a Si substrate according to claim 1, wherein said second gas seed is $PH_3$.

4. A process for the growth of III-V group compound semiconductor crystal on a Si substrate according to claim 3, wherein said chloride is supplied into said growing chamber before said $PH_3$ is supplied thereinto.

5. A process for the growth of III-V group compound semiconductor crystal on a Si substrate according to claim 1, wherein said chloride is supplied into said growing chamber before said second gas seed is supplied.

* * * * *